(12) United States Patent
Cho et al.

(10) Patent No.: US 10,886,451 B2
(45) Date of Patent: Jan. 5, 2021

(54) THERMOELECTRIC MATERIAL, METHOD OF FABRICATING THE SAME, AND THERMOELECTRIC DEVICE

(71) Applicant: UNIVERSITY-INDUSTRY FOUNDATION (UIF), YONSEI UNIVERSITY, Seoul (KR)

(72) Inventors: Mann Ho Cho, Seoul (KR); Hye Jin Choi, Gyeonggi-do (KR); Ji Min Chae, Seoul (KR); Han Bum Park, Seoul (KR)

(73) Assignee: UNIVERSITY-INDUSTRY FOUNDATION (UIF), YONSEI UNIVERSITY, Seoul (KR)

( * ) Notice: Subject to any disclaimer, the term of this patent is extended or adjusted under 35 U.S.C. 154(b) by 244 days.

(21) Appl. No.: 15/536,268

(22) PCT Filed: Mar. 9, 2017

(86) PCT No.: PCT/KR2017/002557
§ 371 (c)(1),
(2) Date: Jun. 15, 2017

(87) PCT Pub. No.: WO2017/188590
PCT Pub. Date: Nov. 2, 2017

(65) Prior Publication Data
US 2019/0035995 A1    Jan. 31, 2019

(30) Foreign Application Priority Data
Apr. 28, 2016    (KR) .......................... 10-2016-0052070

(51) Int. Cl.
| | |
|---|---|
| *H01L 35/26* | (2006.01) |
| *H01L 35/16* | (2006.01) |
| *H01L 35/34* | (2006.01) |
| *H01L 35/32* | (2006.01) |
| *H01L 27/16* | (2006.01) |

(Continued)

(52) U.S. Cl.
CPC .............. *H01L 35/26* (2013.01); *H01L 35/16* (2013.01); *H01L 35/32* (2013.01); *H01L 35/34* (2013.01);
(Continued)

(58) Field of Classification Search
CPC ......... H01L 35/26; H01L 35/32; H01L 35/16; H01L 35/34; H01L 27/16; H01L 35/00;
(Continued)

(56) References Cited

U.S. PATENT DOCUMENTS

| | | | |
|---|---|---|---|
| 5,415,699 A | 5/1995 | Harman | |
| 2006/0032526 A1* | 2/2006 | Fukutani | .............. C30B 29/605 136/205 |

(Continued)

FOREIGN PATENT DOCUMENTS

| | | |
|---|---|---|
| KR | 10-2012-0085639 | 8/2012 |
| KR | 10-1207300 | 12/2012 |
| KR | 10-2014-0116668 | 10/2014 |

OTHER PUBLICATIONS

M. Winkler "Sputtered p-Type Sb2Te3/(Bi,Sb)2Te3 Soft Superlattices Created by Nanoalloying" Journal of Electronic Materials, vol. 41, No. 6, 2012 (Year: 2012).*

(Continued)

*Primary Examiner* — Michael Y Sun

(57) ABSTRACT

Provided are a thermoelectric material, a method of fabricating the same, and a thermoelectric device. The thermoelectric material includes a first material layer including a chalcogen element; and a second material layer including a reaction compound between the chalcogen element and a metal element, wherein the thermoelectric material has a structure in which the first material layer is inserted in the second material layer.

8 Claims, 16 Drawing Sheets

(51) Int. Cl.
  *H01L 35/00* (2006.01)
  *H01L 21/06* (2006.01)
  *H01L 35/18* (2006.01)
  *H01L 35/02* (2006.01)
  *H01L 35/12* (2006.01)
(52) U.S. Cl.
  CPC .............. *H01L 21/06* (2013.01); *H01L 27/16* (2013.01); *H01L 35/00* (2013.01); *H01L 35/02* (2013.01); *H01L 35/12* (2013.01); *H01L 35/18* (2013.01)
(58) Field of Classification Search
  CPC ......... H01L 21/06; H01L 35/02; H01L 35/12; H01L 35/18
  See application file for complete search history.

(56) References Cited

U.S. PATENT DOCUMENTS

2009/0137400 A1* 5/2009 Hahakura ............... C23C 14/06
  505/234
2010/0233454 A1 9/2010 Johnson et al.
2014/0373888 A1* 12/2014 Boukai ................... H01L 35/32
  136/200

OTHER PUBLICATIONS

International Search Report dated May 30, 2017 for PCT/KR2017/002557.

* cited by examiner

THERMOELECTRIC MATERIAL, METHOD OF FABRICATING THE SAME, AND THERMOELECTRIC DEVICE

This application claims the priority of Korean Patent Application No. 10-2016-0052070, filed on Apr. 28, 2016 in the KIPO (Korean Intellectual Property Office), the disclosure of which is incorporated herein entirely by reference. Further, this application is the National Stage application of International Application No. PCT/KR2017/002557, filed Mar. 9, 2017, which designates the United States and was published in Korean. Each of these applications is hereby incorporated by reference in their entirety into the present application.

TECHNICAL FIELD

The present disclosure relates to a semiconductor technique, and more particularly, to a thermoelectric material having excellent thermoelectric performance, a method of fabricating the same, and a thermoelectric device using the same.

BACKGROUND ART

Thermoelectricity refers to interconversion between heat energy and electrical energy using the Peltier effect and the Seebeck effect. As a typical application, active cooling or waste heat recovery power generation may be embodied by using the thermoelectricity. The active cooling improves the thermal stability of an electronic device, does not generate vibration and noise, and does not use a separate condenser and a refrigerant, and thus a compact and environmental-friendly cooling device may be embodied. In case of the waste heat recovery power generation, since waste heat may be utilized as an energy source, automobile efficiency may be improved by using heat from an automobile engine and exhausted heat or body heat of the human body may be utilized as a power source of a mobile device, and thus applications to wide range of fields may be expected.

However, in order to commercialize thermoelectric technology, it is necessary to improve the thermoelectric figure of merit (ZT), which is a dimensionless performance index indicating heat-electricity conversion efficiency of a thermoelectric material and to embody high efficiency in a large-capacity material. However, in order to have a high ZT, a thermoelectric material capable of overcoming the trade-off relationship between electric conductivity and heat conductivity is demanded by the existing physical and/or material engineering viewpoints. As a typical thermoelectric material, a chalcogenide compound is synthesized into a bulk type or a nanowire type to embody high ZT. However, the bulk type chalcogen compound has a very limited applicability through the characteristic for reducing lattice heat conductivity by scattering only short or long wavelength phonons via the grain boundary or lattice point defects. Furthermore, although a one-dimensional element, such as a nanowire, has an effect of increasing phonon scattering over a wide specific surface area, the electric conductivity thereof is reduced at the same time. As a result, ZT is reduced.

DISCLOSURE OF THE INVENTION

Technical Problem

Provided is a thermoelectric material with improved thermoelectric energy conversion efficiency capable of obtaining improved Peltier effect and Seebeck effect by effectively scattering phonons and obtaining excellent thermoelectric figure of merit (ZT) based on excellent electrical conductivity.

Provided is a method of fabricating a thermoelectric material having the above-stated advantages.

Provided is a thermoelectric device using a thermoelectric material having the above-stated advantages.

Technical Solution

According to an aspect of an embodiment, a thermoelectric material includes a first material layer including a chalcogen element; and a second material layer including a reaction compound between the chalcogen element and a metal element, wherein the thermoelectric material has a structure in which the first material layer is inserted in the second material layer. The first material layer and the second material layer may constitute a super lattice structure.

Furthermore, according to an embodiment, the first material layer and the second material layer may be repeatedly stacked. The thermoelectric material may be formed on a substrate, and the first material layer and the second material layer may be alternately arranged in a direction parallel to the main surface of the substrate.

According to an embodiment, the chalcogen element may include sulfur (S), selenium (Se), or tellurium (Te), and the metal element may include bismuth (Bi), antimony (Sb), tin (Sn), or a combination thereof. Preferably, the first material layer may include a tellurium (Te) layer, and the second material layer may include a $Bi_2Te_3$ layer.

According to an embodiment, the thickness of the first material layer may be smaller than or equal to the thickness of the second material layer. Furthermore, the thermoelectric material may include a plurality of open-type pores. The plurality of open-type pores may be provided by volatilization of the first material layer.

According to another aspect of an embodiment, a method of fabricating a thermoelectric material, the method includes forming a first temporary layer including a metal element on a substrate; forming a second temporary layer including a chalcogen element reacting with the metal element on the first temporary layer; forming a temporary stacked structure by repeating the forming of the first temporary layer and the forming of the second temporary layer each for at least once; and applying energy to the temporary stacked structure to induce a reaction between the metal element of the first temporary layer and the chalcogen element of the second temporary layer and causing some of the chalcogen element of the second temporary layer to remain unreacted, thereby forming a multilayered structure in which first material layers including the unreacted and remaining chalcogen element and second material layers including a reaction compound between the metal element and the chalcogen element.

According to an embodiment, the energy is heat energy, and the heat energy may be transferred from the substrate toward the first temporary layer. The heat energy may have a heating temperature from about 100° C. to about 220° C.

According to an embodiment, the thickness of the second temporary layer may be greater than the thickness of the first temporary layer. The metal element may include bismuth (Bi), antimony (Sb), tin (Sn), or a combination thereof, and the chalcogen element may include sulfur (S), selenium (Se), or tellurium (Te).

The first material layer may include a tellurium (Te) layer, and the second material layer may include a $Bi_2Te_3$ layer.

According to an embodiment, the method may further include forming a plurality of pores in the multilayered structure.

According to another aspect of an embodiment, a thermoelectric device includes the thermoelectric material; and a first electrode and a second electrode formed at a first end and a second end of the thermoelectric material, respectively. Furthermore, the thermoelectric material may be formed on a flexible substrate, Advantageous Effects According to an embodiment of the present invention, there is provided a thermoelectric material with excellent thermoelectric energy conversion efficiency by having a super lattice structure including a first material layer including a chalcogen element and a second material layer including a reaction compound between the chalcogen element and a metal element, wherein the super lattice structure in which the first material layer is inserted in the second material layer secure very low heat conductivity and very high electrical conductivity by effectively scattering medium-wavelength phonons at the interface between the two material layers of the super lattice structure.

Furthermore, according to another embodiment of the present invention, since a thermoelectric material having a high thermoelectric energy conversion efficiency index may be fabricated at a low temperature including the room temperature, a method of fabricating a thermoelectric material that is economical and applicable to a flexible device may be provided.

According to another embodiment of the present invention, a high efficiency thermoelectric device using a thermoelectric material having the above-described advantages may be provided.

MODE FOR CARRYING OUT THE INVENTION

Figure 1:
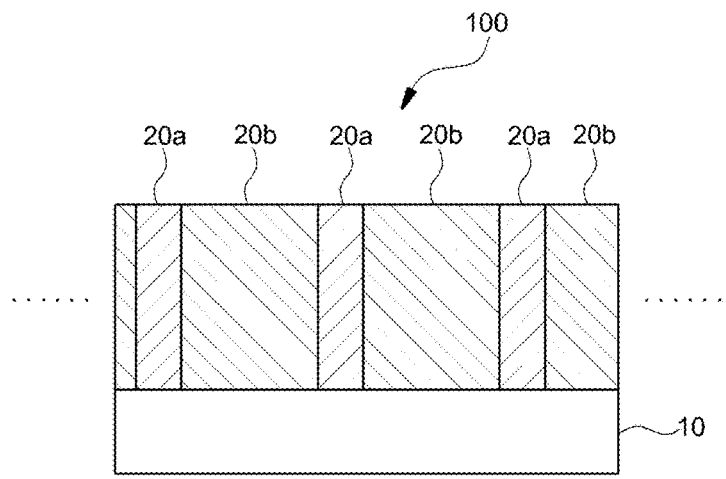
FIG. 1 is a cross-sectional diagram showing a structure of a thermoelectric material according to an embodiment of the present invention.

Reference will now be made in detail to embodiments, examples of which are illustrated in the accompanying drawings, wherein like reference numerals refer to like elements throughout.

In this regard, the present embodiments may have different forms and should not be construed as being limited to the descriptions set forth herein. Accordingly, the embodiments are merely described below, by referring to the figures, to explain aspects.

Reference numerals of members in the drawings refer to the same members throughout the drawings. As used herein, the term "and/or" includes any and all combinations of one or more of the associated listed items The terms used in the present specification are merely used to describe particular embodiments, and are not intended to limit the present disclosure. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Reference herein to a layer formed "on" a substrate or other layer refers to a layer formed directly on top of the substrate or other layer or to an intermediate layer or intermediate layers formed on the substrate or other layer. It will also be understood by those skilled in the art that structures or shapes that are "adjacent" to other structures or shapes may have portions that overlap or are disposed below the adjacent features.

In this specification, the relative terms, such as "below", "above", "upper", "lower", "horizontal", and "vertical", may be used to describe the relationship of one component, layer, or region to another component, layer, or region, as shown in the accompanying drawings. It is to be understood that these terms are intended to encompass not only the directions indicated in the figures, but also the other directions of the elements.

Hereinafter, embodiments of the present disclosure will be described with reference to cross-sectional diagrams schematically showing ideal embodiments (and intermediate structures) of the present disclosure. In the drawings, for example, sizes and shapes of the members may be exaggerated for convenience and clarity of explanation, and in actual implementation, variations of the illustrated shapes may be expected. Accordingly, the embodiments of the present disclosure should not be construed as being limited to the specific shapes of the regions shown herein. In addition, reference numerals of members in the drawings refer to the same members throughout the drawings FIG. 1 is a cross-sectional diagram showing a structure of a thermoelectric material 100 according to an embodiment of the present invention.

Referring to FIG. 1, the thermoelectric material 100 may be formed on a substrate 10. The substrate 10 may be an insulating substrate itself, such as a ceramic substrate or a polyimide substrate, a semiconductor substrate, such as a silicon wafer, or even a conductive substrate, such as a lead frame. Furthermore, an insulating film, such as a silicon oxide film, a silicon nitride film, or an aluminum oxide film, a metal conductive film, or a semiconductor film may be formed on a surface of such the substrate 10. However, the present invention is not limited thereto. Since the thermoelectric material 100 may be synthesized at a low temperature as described below, the substrate 10 may be formed of a flexible polymeric-based material, such as a resin-based material. Alternatively, the thermoelectric material 100 may be formed on a conductive substrate or a conductive film. In this case, the conductive substrate or the conductive film may constitute an electrode of a thermoelectric device.

The thermoelectric material 100 may have a structure in which a first material layer 20a is inserted in a second material layer 20b. According to another aspect, the thermoelectric material 100 may include a multi-layer structure in which the second material layer 20b and the first material layer 20a are alternately arranged. The thickness of the first material layer 20a may be less than or equal to the thickness of the second material layer 20b. The structure may be formed, because the first material layer 20a is a reaction residue. The fact that the first material layer 20a is a reaction residue is also related to a synergistic effect regarding thermoelectric effect.

The first material layer 20a includes a chalcogen element. The chalcogen element may be sulfur (S), selenium (Se), or tellurium (Te). The second material layer 20b may include a reaction compound between the chalcogen element and a metal element. The metal element may be bismuth (Bi), antimony (Sb), tin (Sn), or a combination thereof. For example, the reactive compound of the second material layer 20b may include $Bi_2Te_3$, $Sb_2Te_3$, SnSe, or a combination thereof.

As shown in FIG. 1, the first material layer 20a and the second material layer 20b may constitute a super lattice structure in which the first material layer 20a and the second material layer 20b are alternately arranged and overlap each other twice or more number of times. The crystallinity and the epitaxial relationship of the first material layer 10a and the second material layer 10b may appear locally or throughout the thermoelectric material 100, and embodiments of the present invention encompass the both cases. The super lattice structure corresponds to a crystal structure in which the first material layer 20a and the second material layer 20b are alternately stacked in a direction parallel to a main surface of the insulating layer.

According to an embodiment, the thermoelectric material may have a thickness from 10 nm to 100 nm. When the thickness of the thermoelectric material is less than 10 nm, it is difficult for phonons to be transferred, and thus it is difficult to improve a thermoelectric energy conversion index. When the thickness exceeds 100 nm, it is difficult to obtain a regular super lattice structure.

As described below, when the chalcogen element of the first material layer 20a is partially volatilized during an annealing process, a plurality of pores may be formed in the manufactured thermoelectric material 100. According to an embodiment, when the thermoelectric material 100 has a layered structure, as the first material layer 20a is volatilized, open-type pores provided by the voids of the first material layer 20a may be provided between portions of the second material layers 20b.

Figure 2:
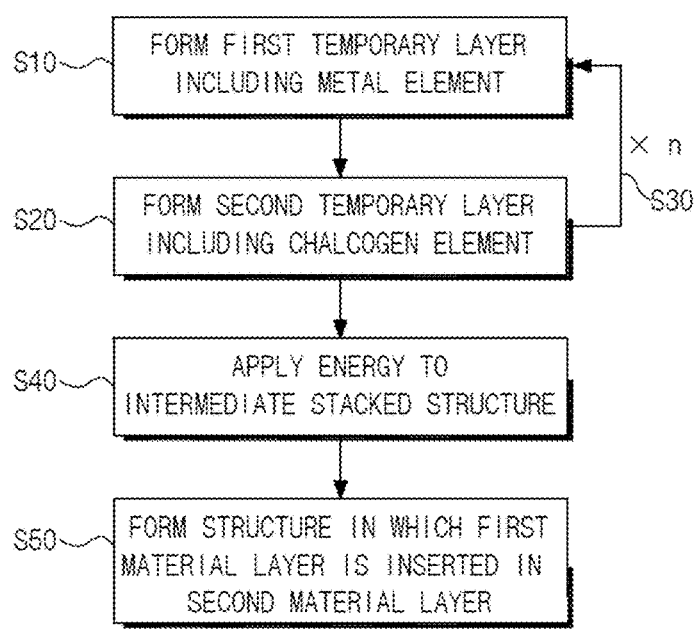
FIG. 2 is a flowchart for describing a method of manufacturing a thermoelectric material according to an embodiment of the present invention.
Figure 3A:
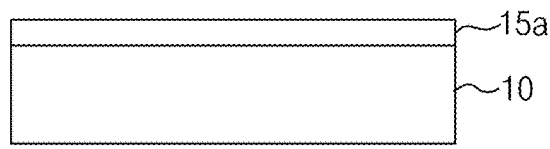
FIGS. 3A through 3C are cross-sectional diagrams showing results of the method of FIG. 2.
Figure 3B:
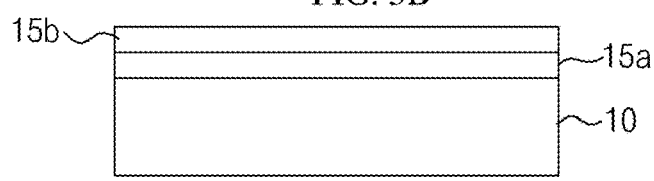
Figure 3C:
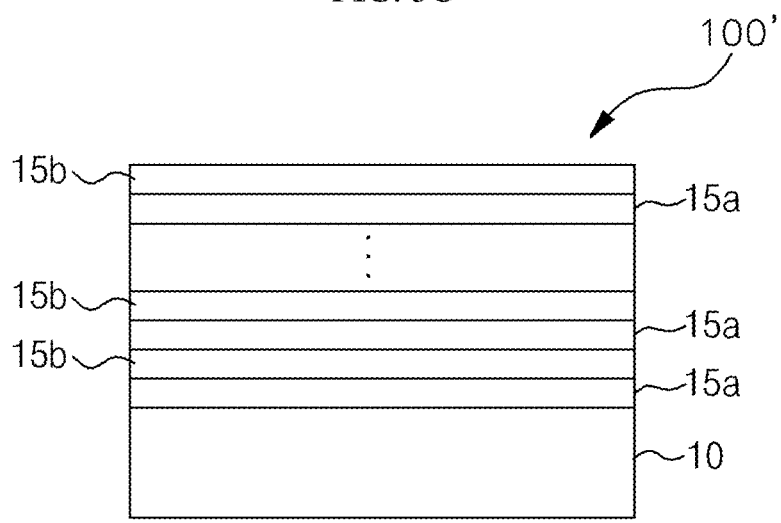

FIG. 2 is a flowchart for describing a method of manufacturing a thermoelectric material according to an embodiment of the present invention, and FIGS. 3A through 3C are cross-sectional diagrams showing results of the method of FIG. 2.

Referring to FIG. 3A together with FIG. 2, a first temporary layer 15a including a metal element is formed on the substrate 10 (operation S10). The substrate 10 may be an insulating film, such as a silicon oxide film, a silicon nitride film, or an aluminum oxide film. However, those are merely examples and, as described above, the first temporary layer 15a may be formed on an unlimited substrate including a conductive material or a semiconductor material.

The metal element of the first temporary layer 15a may be bismuth (Bi), antimony (Sb), tin (Sn), or a combination thereof. The thickness of the first temporary layer 15a may be in the range from 2 nm to 9 nm. The substrate 10 may be an insulating substrate itself, a semiconductor substrate, such as a silicon substrate, or even an insulating film, such as a silicon oxide film, a silicon nitride film, or an aluminum oxide film formed on a conductive substrate, as described above, and the present invention is not limited thereto.

The first temporary layer 15a may be formed by thermal deposition. The first temporary layer 15a may also be formed via another thin-film forming process, such as sputtering, chemical vapor deposition, or atomic layer deposition. However, the first temporary layer 15a may be preferably formed by thermal deposition in which a metal itself is used as a deposition source for reduced risk of including an impurity and a thin-film may be formed on the substrate 10 with a relatively low kinetic energy at a low temperature.

Referring to FIG. 3B together with FIG. 2, a second temporary layer 15b including a chalcogen element reacting with the metal element is formed on the first temporary layer 15a (operation S20). The chalcogen element may be sulfur (S), selenium (Se), or tellurium (Te).

The second temporary layer 15b may also be formed by thermal deposition. The second temporary layer 15b may be formed via another thin film forming process, such as sputtering, chemical vapor deposition, or atomic layer deposition. However, the second temporary layer 15b may preferably be formed by the thermal deposition method. The thermal deposition method is advantageous for layer-by-layer deposition and allows uniform diffusion into an underlying layer, and thus the thickness of each layer may be controlled within a range of several Å without deteriorating the layered structure.

The thickness of the second temporary layer 15b may be greater than the thickness of the first temporary layer 15a. The reason thereof is that the second temporary layer 15b reacts with the first temporary layer 15a to completely exhaust the metal element and retain the chalcogen element. According to an embodiment, the thickness of the second temporary layer 15b may be from two to four times the thickness of the first temporary layer 15a. For example, the thickness of the second temporary layer 15b may be in the range from 6 nm to 20 nm.

Referring to FIG. 3C together with FIG. 2, an intermediate stacked structure 100' may be formed by repeating the operations for forming the first temporary layer 15a and the second temporary layer 15b at least once or more number of times (operation S30). The repeating operation S30 may be repeated from 10 to 60 times. However, the number of the repetitions is merely an example, and the present invention is not limited thereto. The number of repetitions may vary depending on the thicknesses of the first temporary layer 15a and the second temporary layer 15b to be formed and the size of a thermoelectric material to be obtained.

According to an embodiment, the thickness of the intermediate stacked structure 100' may be in the range from 40 nm to 60 nm. The formed intermediate stacked structure 100' is a stacked structure of the first temporary layer 15a including the metal element 15a and the second temporary layer 15b including the chalcogen element and may be formed at a low temperature and have an amorphous structure.

Referring to FIG. 2, energy is subsequently applied to the intermediate stacked structure 100' (operation S40). The energy is energy for an annealing process to enable interlayer diffusion of the constituent elements in the intermediate stacked structure 100' having a stacked structure. The energy may be heat energy, electric energy, or optical energy. Preferably, the energy may be heat energy.

The annealing may be performed under ultrahigh vacuum. For example, the annealing may be performed in-situ in a chamber in which the temporary layers 15a and 15b are deposited. The pressure at this time may be in the range from $2\times10^{-8}$ torr to $8\times10^{-8}$ torr. The heat energy supplied for the annealing may be transferred from the substrate 10 to the first temporary layer 15a.

The annealing temperature may be in the range from 100° C. to 240° C. Preferably, the annealing temperature may be in the range from 200° C. to 220° C. When the annealing temperature is less than 180° C., it is difficult to induce interlayer diffusion between the constituent elements of the temporary layers 15a and 15b. On the contrary, when the annealing temperature exceeds 250° C. as described below, due to overall volatilization of chalcogen elements remaining after a reaction, a lattice structure in which the first material layer 20a and the second material layer 20a are alternately arranged may not be obtained.

During the annealing process, the intermediate stacked structure 100' having an amorphous multi-layer structure is crystallized. Via the annealing process, the thermoelectric material 100 as shown in FIG. 1 may be formed. The thermoelectric material 100 may have a structure in which the first material layer 20a is inserted in the second material layer 20b or a multilayered structure in which the second material layer 20b and the first material layer 20a are alternately arranged.

The energy induces a reaction between the chalcogen element of the second temporary layer 15b and the metal element of the first temporary layer 15a and causes some of the chalcogen element of the second temporary layer 15b to remain unreacted, thereby forming a thermoelectric material having a multilayered structure in which the first material layer 20a including the unreacted and remaining chalcogen elements and the second material layer 20b that is a reaction layer between the metal element and the chalcogen element.

As shown in FIG. 1, the first material layer 20a and the second material layer 20b may constitute a super lattice structure by being alternately overlapped twice or for more number of times in a horizontal direction of the main surface of the insulation layer 10. The crystallinity and epitaxial relationships of the first material layer 20a and the second material layer 20b may appear locally or throughout the thermoelectric material 100, and embodiments of the present invention encompass the both cases. Furthermore, the super lattice structure may have a structure in which the first material layer 20a and the second material layer 20b are alternately stacked in a direction parallel to the main surface of the insulating layer.

When the heat energy is excessively supplied, unreacted chalcogen elements of the second temporary layer 10 may be volatilized and evaporated, thereby forming pores in the thermoelectric material 100. The pores may be open-type pores. When the heat energy is even more excessively supplied, the first material layer 20a shown in FIG. 1 may completely disappear as all of unreacted chalcogen elements are volatilized. In this case, a structure including the plurality of second material layers 20b that are separated from each other by an empty space having a width substantially identical to that of the disappeared first material layer 20a may be formed on the substrate 10.

FIGS. 4A to 4F are scanning electron microscopic (SEM) images of the top surface of an intermediate stacked structure (see 100' in FIG. 3C) according to temperatures in a heat treatment process for forming a thermoelectric material according to an embodiment of the present invention. FIGS. 4A through 4F show an as-grown state and results of heat treatments performed for 10 minutes to 20 minutes at 100° C., 150° C., 200° C., 220° C. and 250° C., respectively.

Figure 4A:
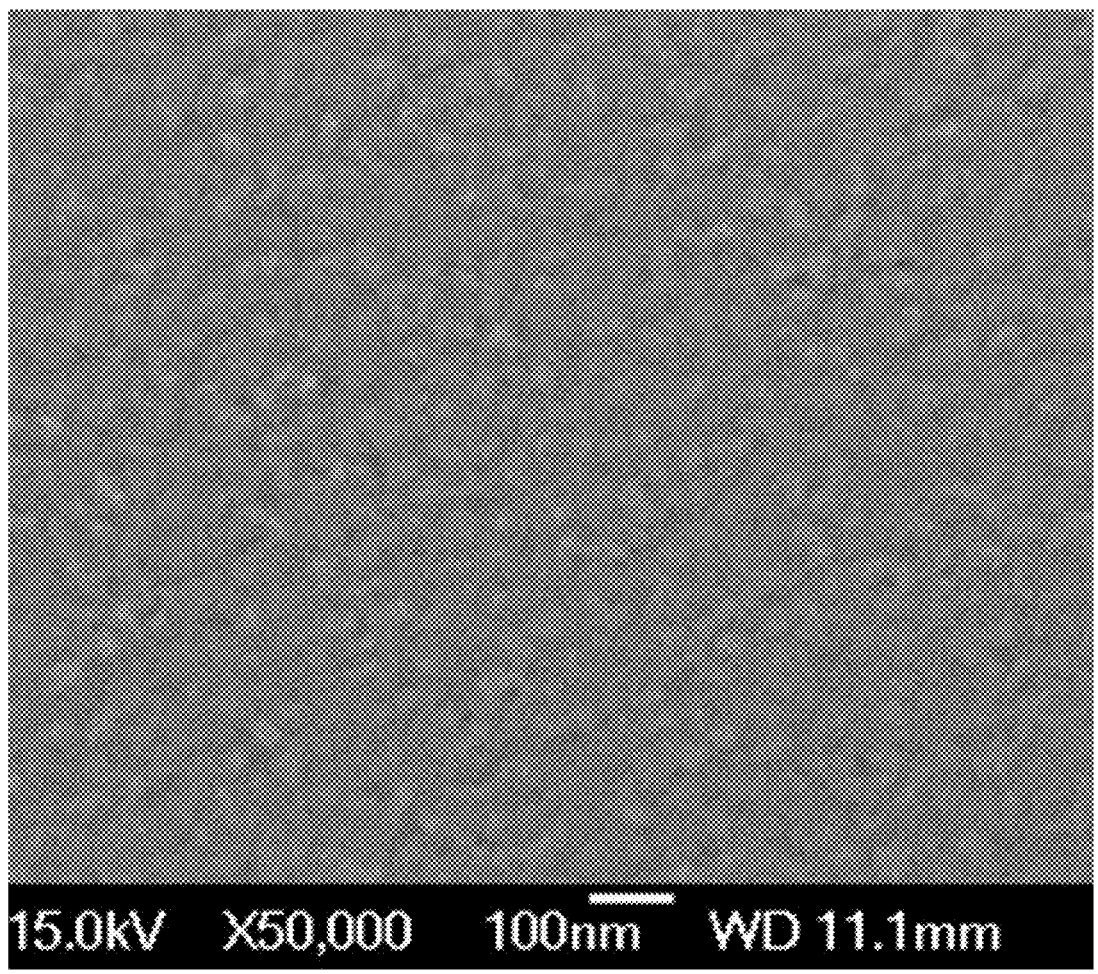
FIGS. 4A to 4F are scanning electron microscopic (SEM) images of the top surface of an intermediate stacked structure according to temperatures in a heat treatment process for forming a thermoelectric material according to an embodiment of the present invention.
Figure 4B:
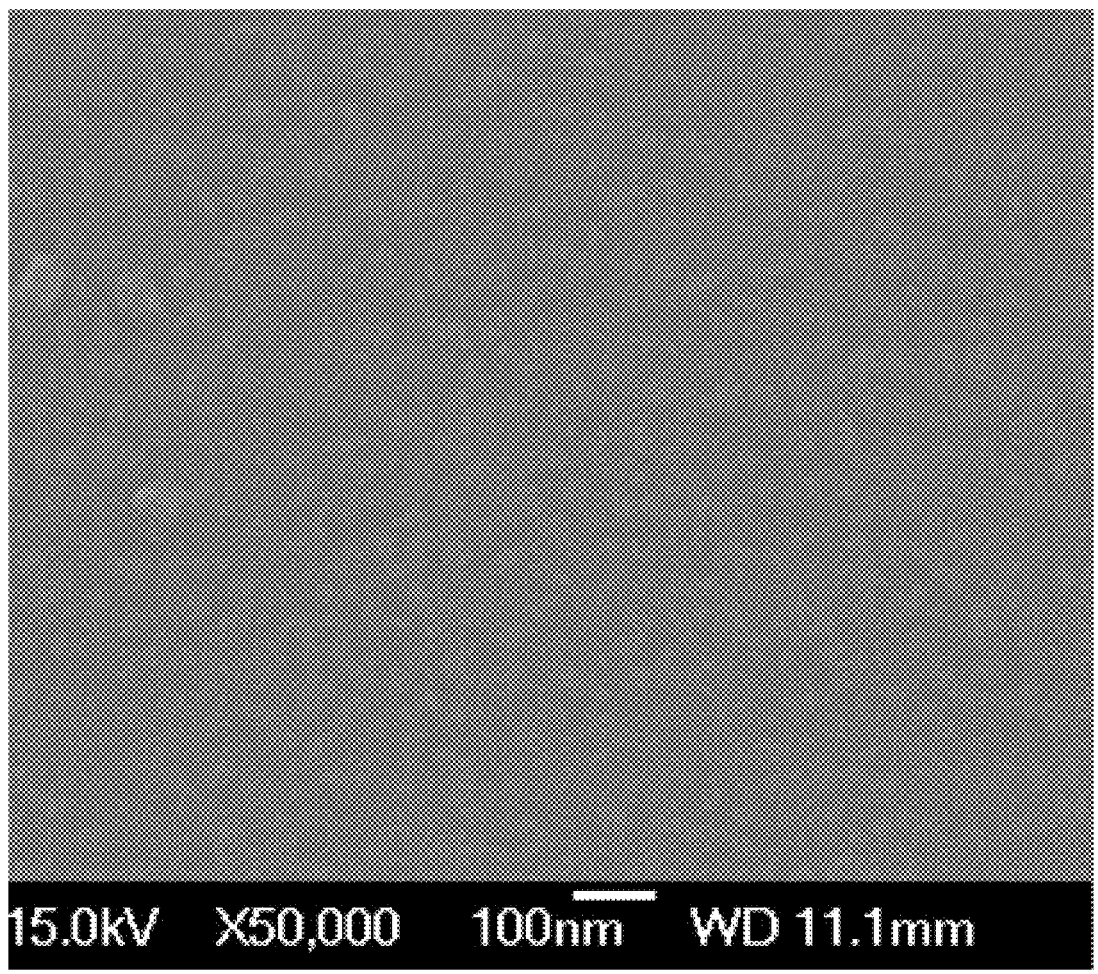
Figure 4C:
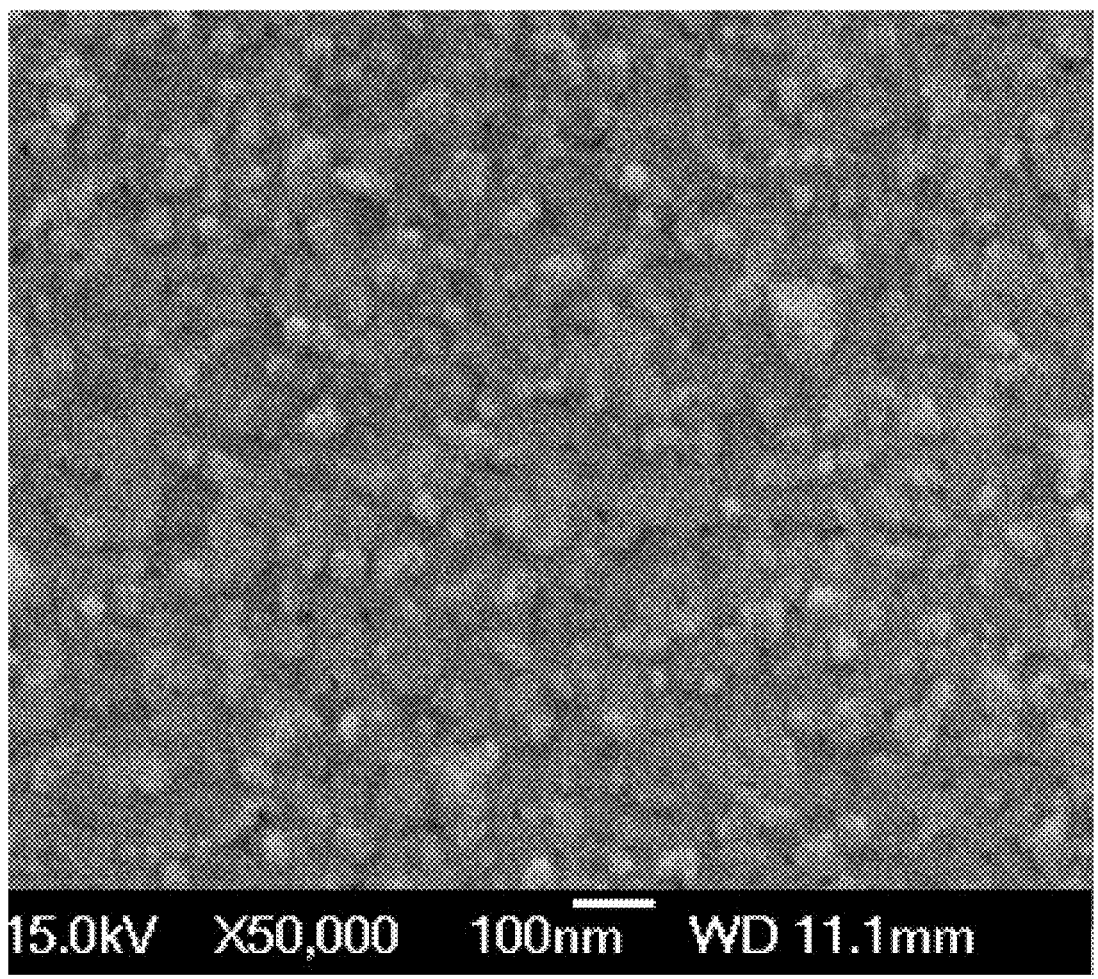

Referring to FIG. 4A, the top surface of an intermediate stacked structure (refer to 100') formed on an insulating layer is very flat and the no pore structure is observed when the intermediate stacked structure is just deposited. Referring to FIGS. 4B and 4C, crystal growths are observed as the heat treatment temperature increases.

Figure 4D:
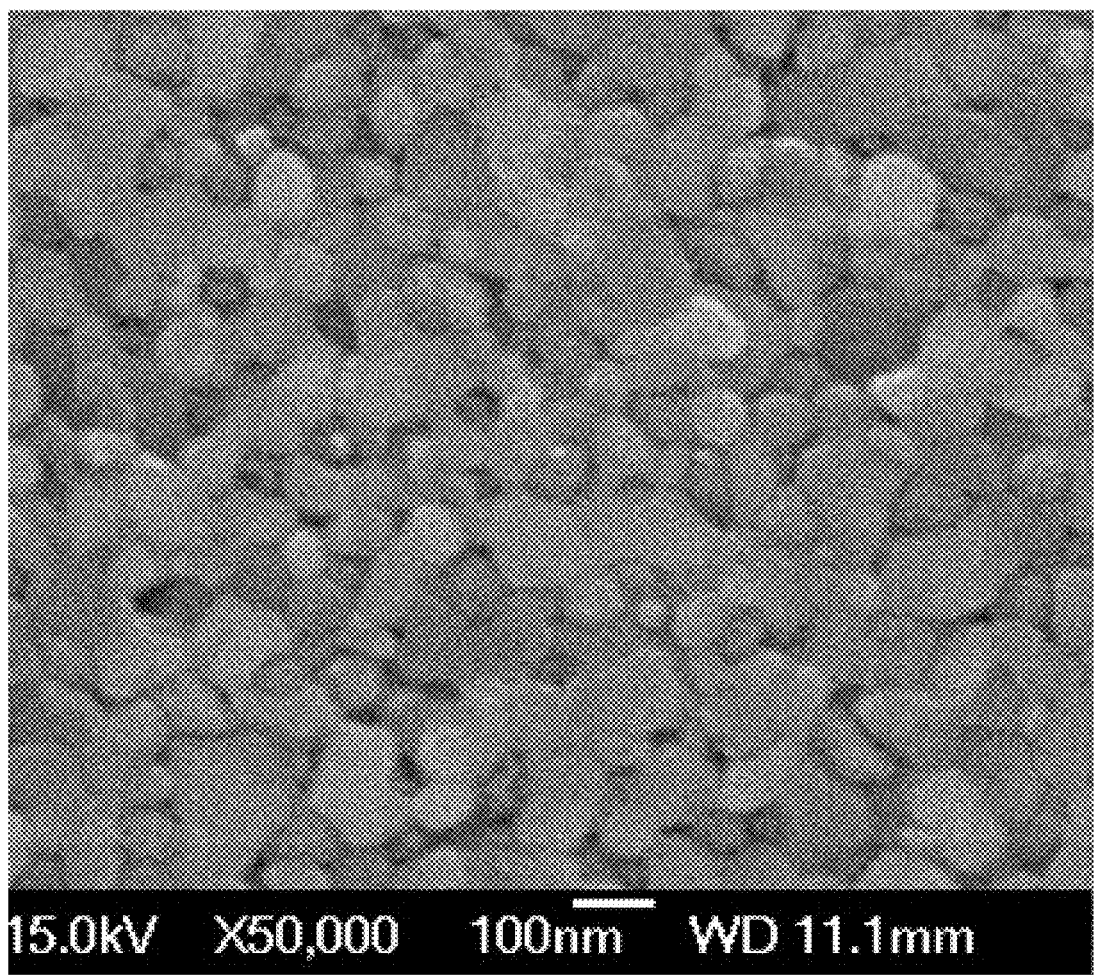
Figure 4E:
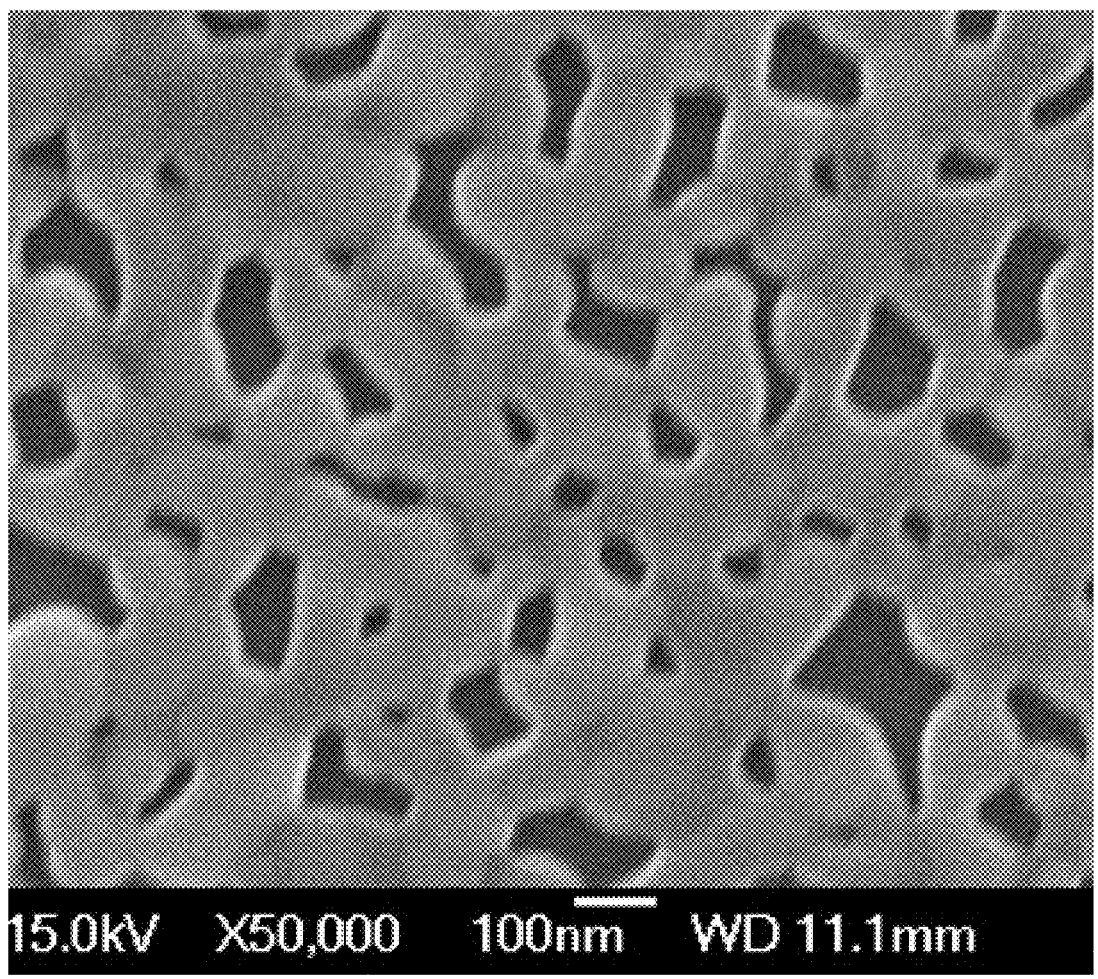
Figure 4F:
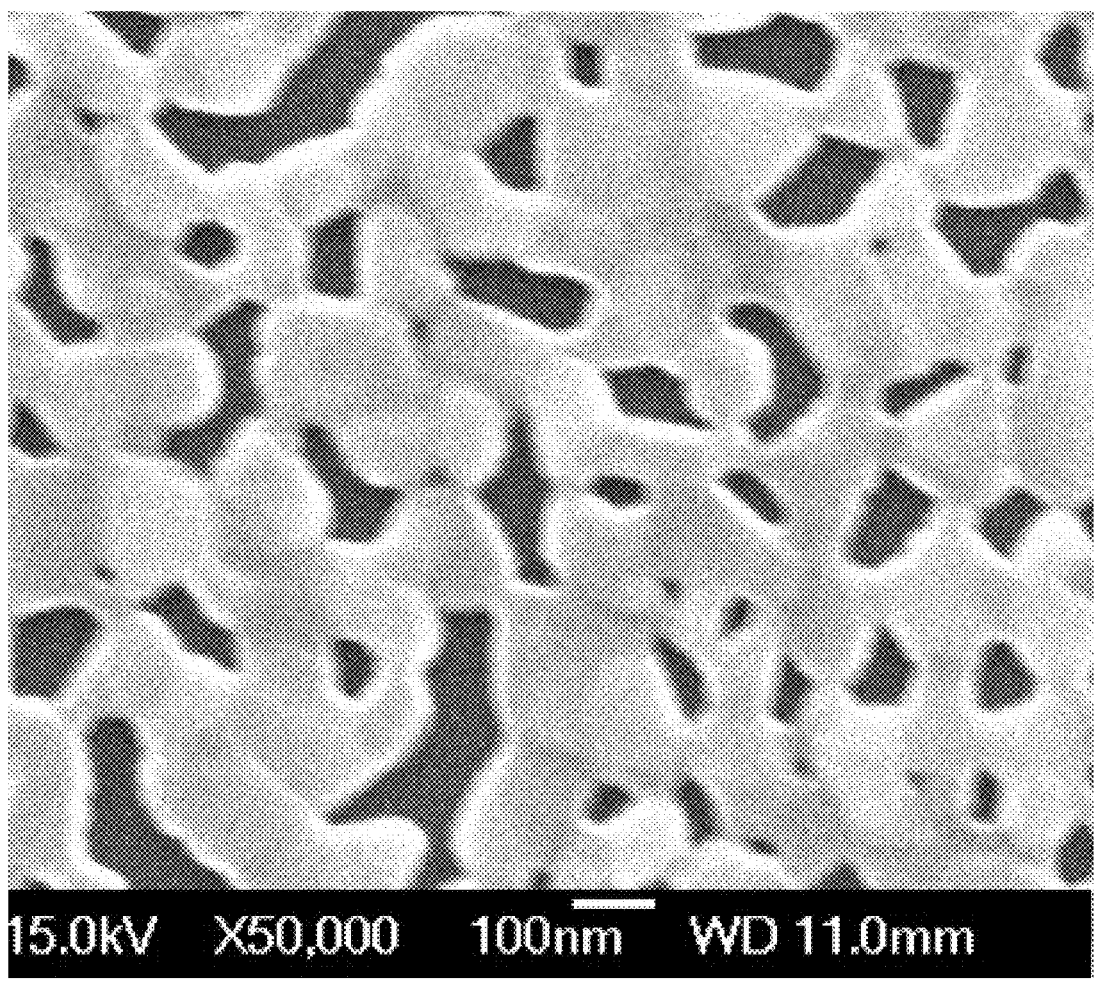

Referring to FIG. 4D, when the heat treatment temperature is 200° C., the progress of crystallization on the surface of the intermediate stacked structure may be observed more clearly. However, referring to FIGS. 4E and 4F, formation of pores begins on the surface of the intermediate stacked structure as the heat treatment temperature is increased to 220° C. and, as the heat treatment temperature is increased to 250° C., the size and the number of pores are also increased. It may be observed that the pores are open-type pores. The open-type pores may support evaporation of the constituent elements of the intermediate stacked structure to the surface as the heat treatment temperature is increased.

Figure 5A:
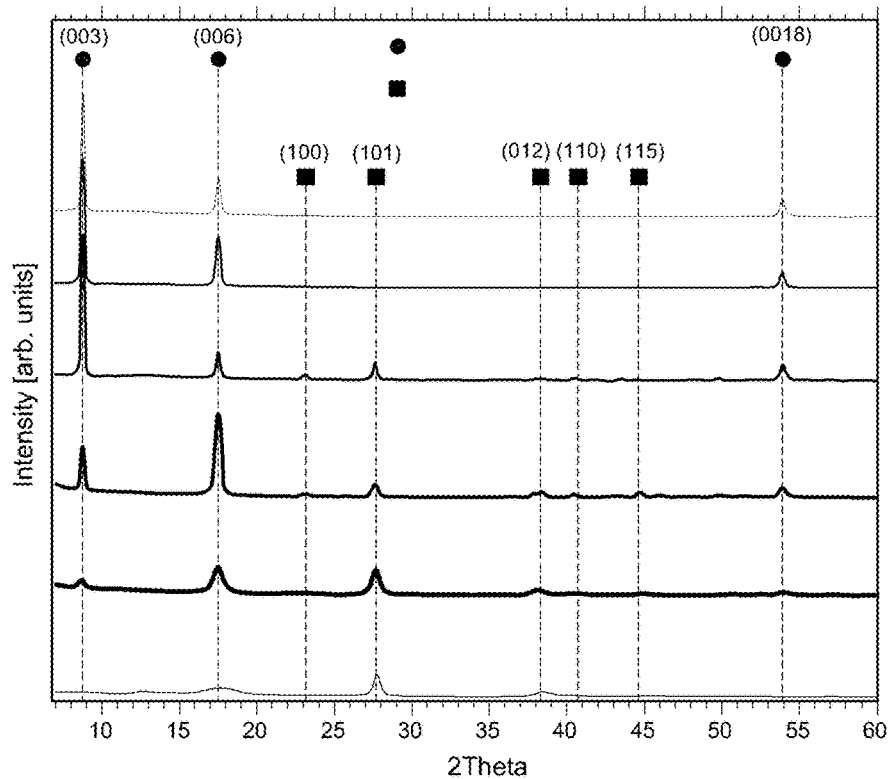
FIG. 5A is a diagram showing an X-ray diffraction analysis result of a thermoelectric material fabricated according to an embodiment of the present invention.
Figure 5B:
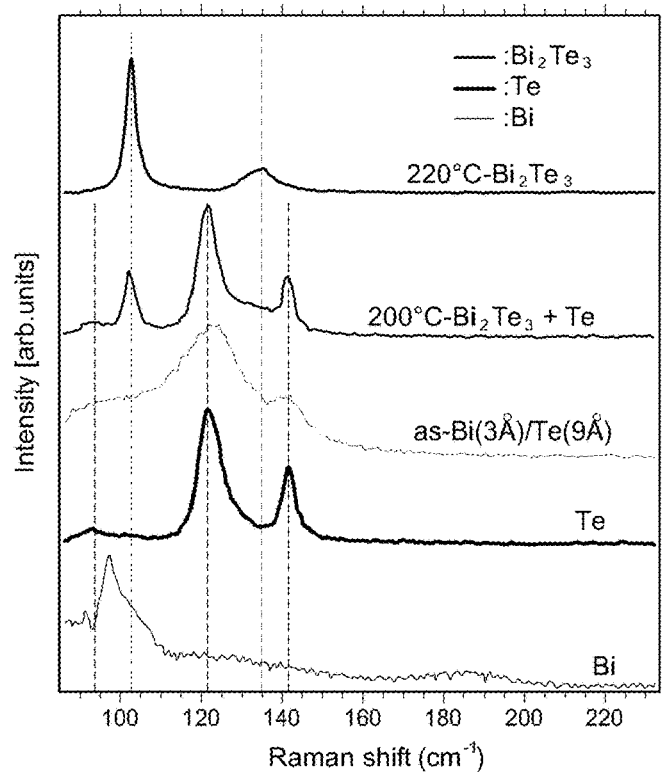
FIG. 5B is a graph showing a result of a Raman analysis.

FIG. 5A is a diagram showing an X-ray diffraction analysis result of the thermoelectric material fabricated according to an embodiment of the present invention, and FIG. 5B is a graph showing a result of a Raman analysis.

Referring to FIG. 5A, the crystal structure, crystal surface, and orientation of each intermediate stacked structure may be detected according to heat treatment temperature. A peak (006) of the rhombohedral crystal structure of $Bi_2Te_3$, which is a reaction compound of a metal element and a chalcogen element, and a peak (101) and a peak (012) of the hexagonal crystal structure of tellurium (Te) are detected even before a heat treatment. The peaks are constantly increased to the heat treatment temperature of 200° C. When the heat treatment temperature reaches 220° C., the peaks of tellurium (Te) disappear and only the peak proportional to (003) of the $Bi_2Te_3$ crystal structure is observed.

Referring to FIG. 5B, Raman spectrum of the same intermediate stacked structure was measured by using a laser having a wavelength of 532 nm. As a result, in the intermediate stacked structure annealed at 200° C., the phonon mode of $Bi_2Te_3$, which is the reaction compound, and the phonon mode of tellurium (Te), which is a chalcogen element, were measured at the same time. However, only the phonon mode of $Bi_2Te_3$ was measured in the intermediate stacked structure annealed at 250° C.

Taking the results of the above X-ray diffraction analysis and Raman measurement into consideration, although the crystal structures of $Bi_2Te_3$ and Te are mixed at the heat treatment temperature of 200° C., when the heat treatment is performed at 220° C. or higher, only the crystal grains of $Bi_2Te_3$, that is, only the second material layer (see 20b in FIG. 1) remains. Furthermore, it may be seen that the rhombohedral crystal structure of the crystallized $Bi_2Te_3$ is all crystallized in the (003) plane-wise directions.

FIGS. 6A through 6D are TEM images for analyzing the cross-sectional structure and the microstructure of an intermediate stacked structure fabricated by a heat treatment at 200° C.

Figure 6A:
FIGS. 6A through 6D are TEM images for analyzing the cross-sectional structure and the microstructure of an intermediate stacked structure fabricated via a heat treatment at 200° C.
Figure 6B:
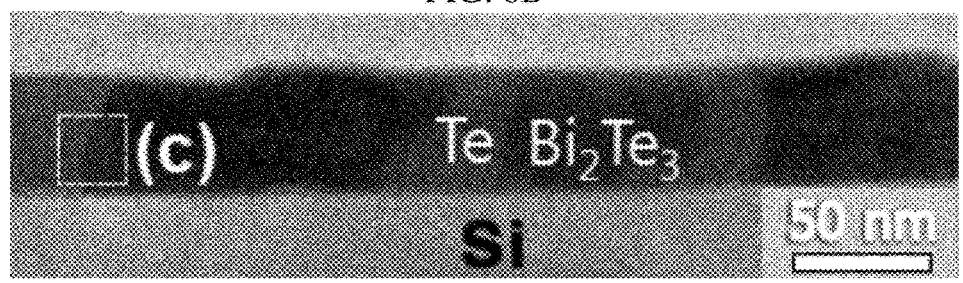

FIG. 6A is a low-magnification cross-sectional image of a focused ion-beam (FIB) treated thermoelectric material. FIG. 6B is a magnified view of a part of the thermoelectric material indicated by the white rectangle in FIG. 6A, where a first material layer (Te; refer to 20a in FIG. 1) and a second material layer ($Bi_2Te_3$; refer to 20b in FIG. 1) are distinguished from each other by colors according to the crystallization planes. Referring to FIG. 6B, it may be observed that the thermoelectric material formed on a substrate Si having formed thereon an insulating layer $SiO_2$ is a super lattice thin-film repeatedly having the structure of (Te/$Bi_2Te_3$) in a horizontal direction.

Figure 6C:
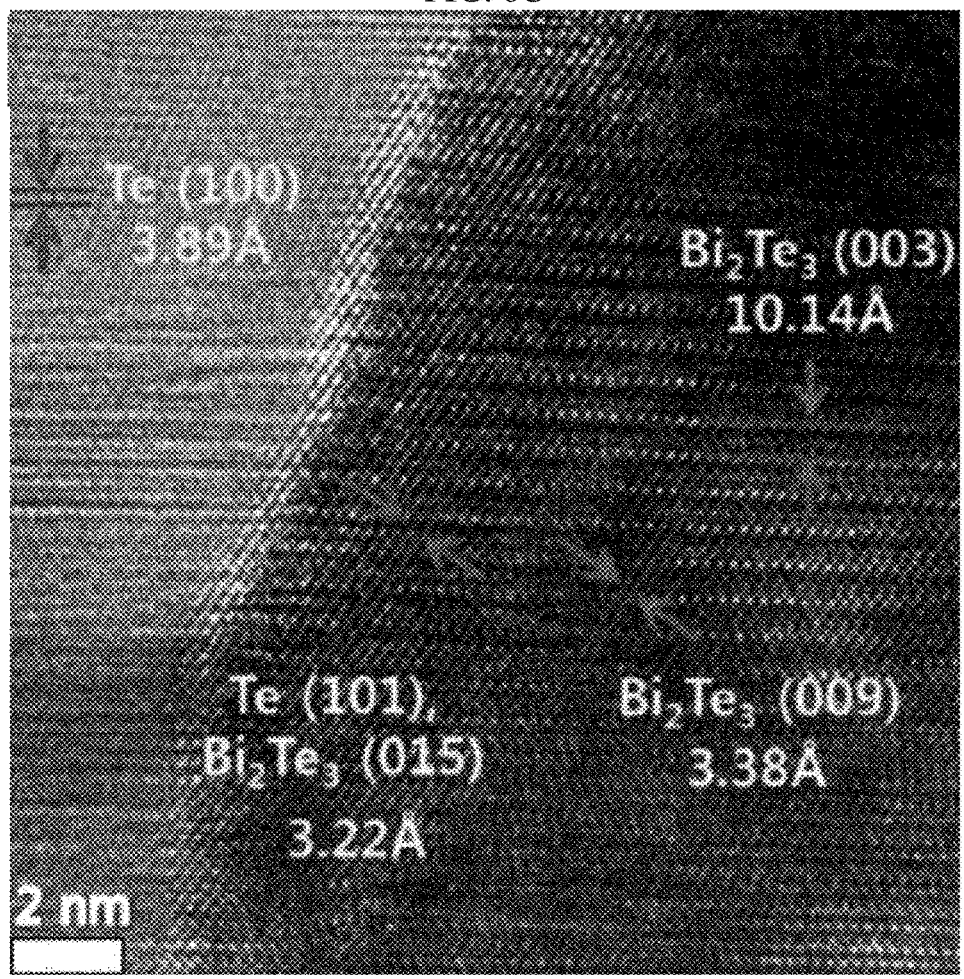

FIG. 6C is a cross-sectional image obtained by magnifying a part of the thermoelectric material indicated by a dotted rectangle in FIG. 6B and measuring it at a high magnification. Referring to FIG. 6C, as a result of measuring the first material layer (Te) and the second material layer ($Bi_2Te_3$) in order to check the crystal structure and plane-wise direction of the first material layer (Te) and the second material layer ($Bi_2Te_3$), the plane-wise directions of the second material layer ($Bi_2Te_3$) were (003) direction and (009) direction, where the result coincides with the XRD measurement result in FIG. 5A. Furthermore, the crystal structure of the first material layer (Te) appears in the (100) plane-wise direction.

Figure 6D:
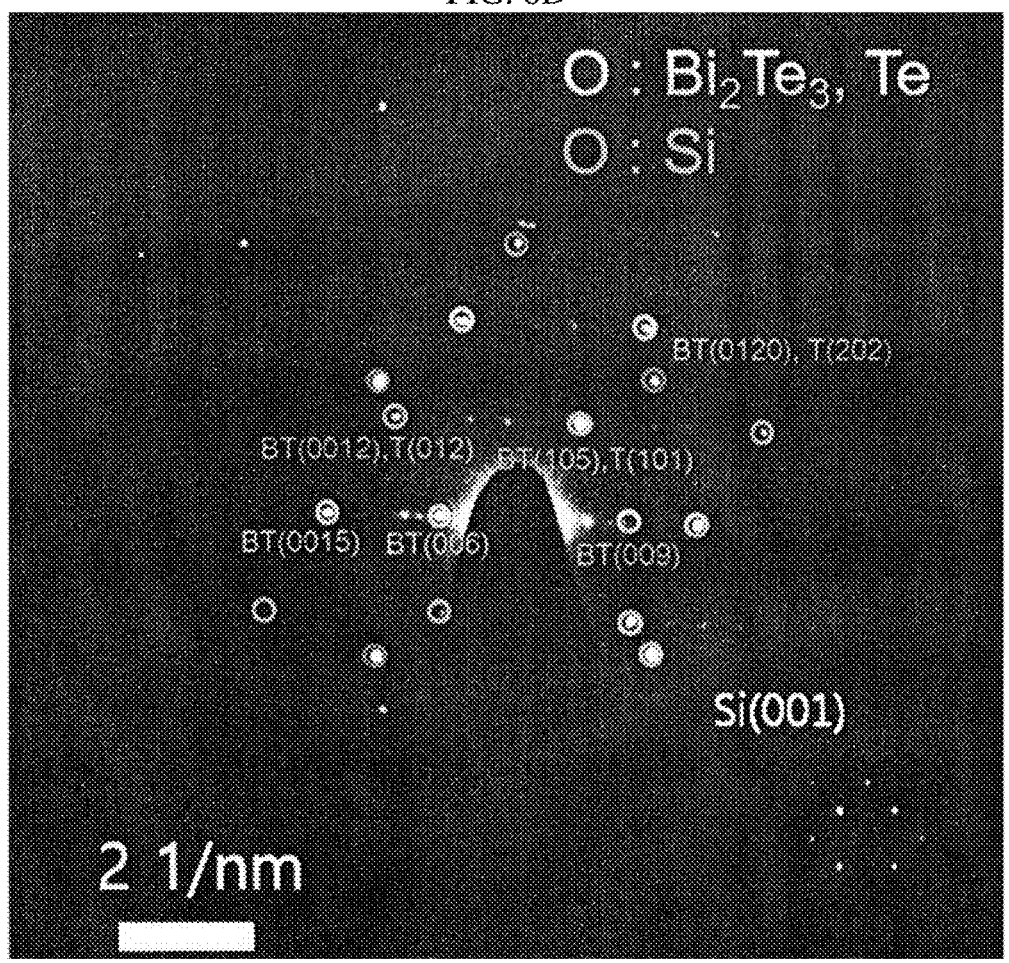

FIG. 6D shows a result of selected area electron diffraction (SAED) pattern analysis, and it may be observed that the crystal structures of $Bi_2Te_3$ and Te were measured at the same time. As a result, the result of SAED coincides with the XRD of FIG. 5A and the Raman spectrum analysis of FIG. 5B.

FIGS. 7A through 7D are TEM images for analyzing the cross-sectional structure and the microstructure of an intermediate stacked structure fabricated by a heat treatment at 250° C. The method used for the measurement in FIGS. 7A through 7D is identical to the method used for measurement in FIGS. 6A through 6D.

Figure 7A:
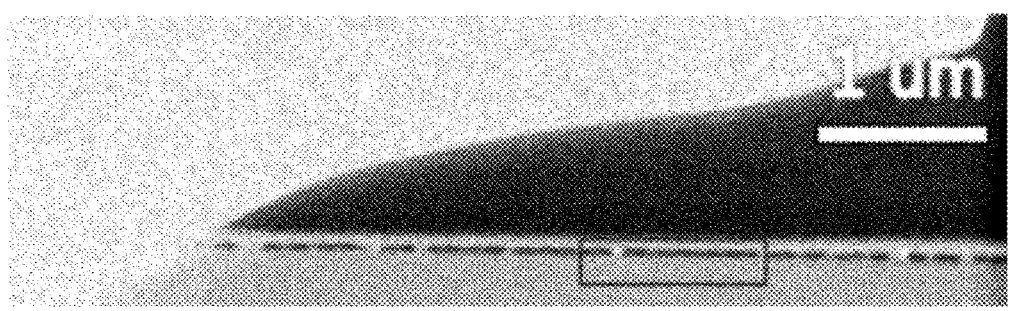
FIGS. 7A through 7D are TEM images for analyzing the cross-sectional structure and the microstructure of an intermediate stacked structure fabricated via a heat treatment at 250° C.
Figure 7B:

FIG. 7A is a low-magnification cross-sectional image of a focused ion-beam (FIB) treated thermoelectric material. FIG. 7B is a magnified image of a part of the thermoelectric material indicated by the red rectangle in FIG. 7A, where a second material layer ($Bi_2Te_3$; refer to 20b in FIG. 1) is distinguished by a color according to the crystallization planes. Referring to FIG. 7B, only crystal structures of the second material layer ($Bi_2Te_3$) were observed in the intermediate stacked structure formed on a substrate Si having formed thereon an insulating layer $SiO_2$ and empty spaces periodically appear between the crystal structures.

Figure 7C:
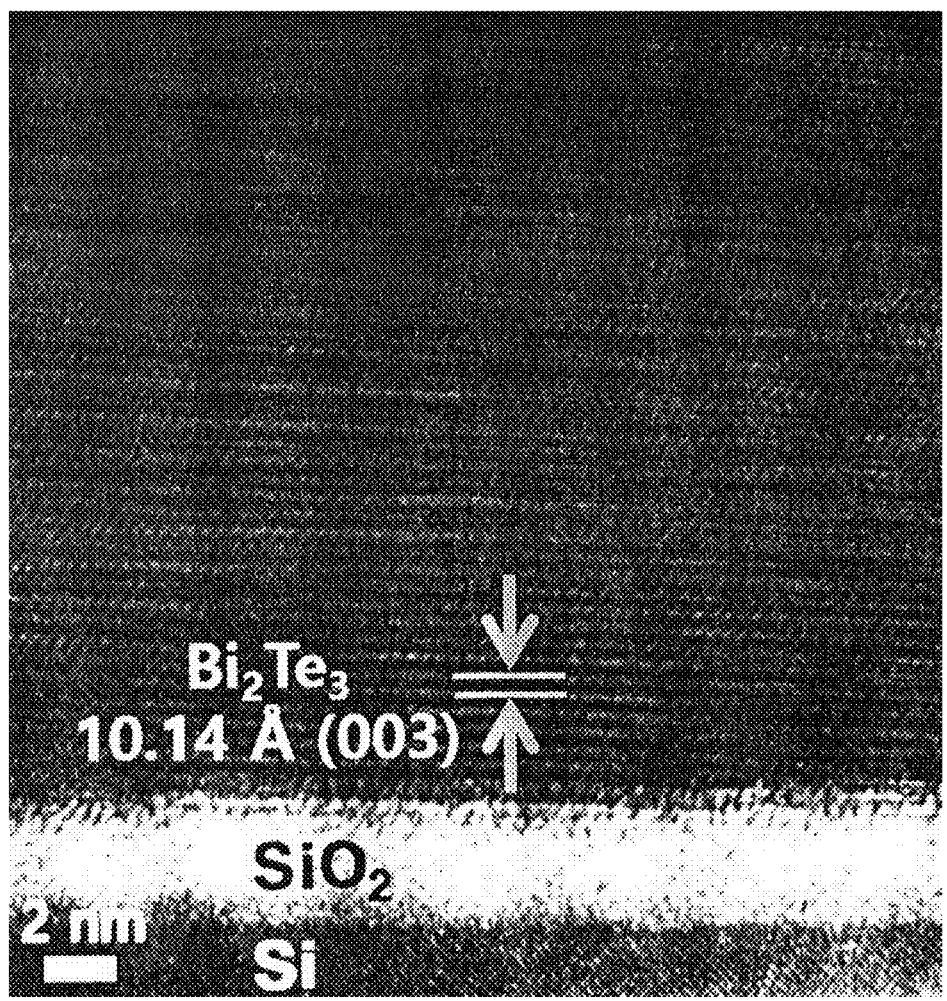
Figure 7D:
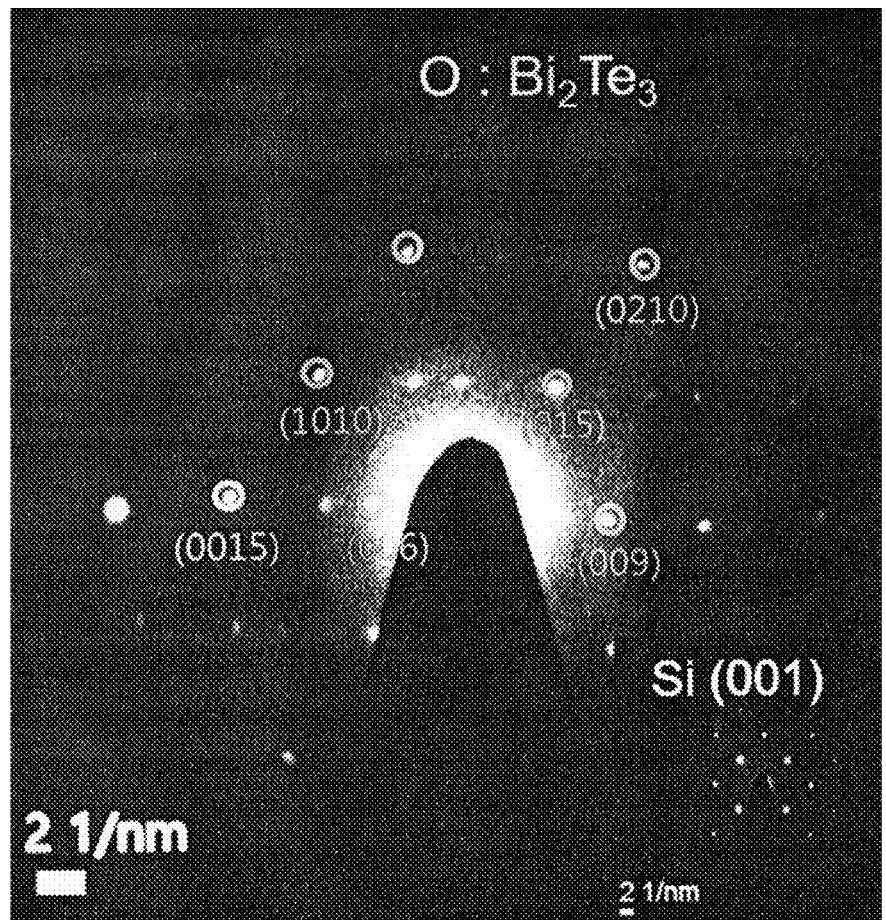

FIG. 7C is a cross-sectional image obtained by magnifying a part of the second material layer ($Bi_2Te_3$) indicated by the dotted rectangle in FIG. 7B and measuring it at a high magnification. Referring to FIG. 7C, the plane-wise directions of the second material layer ($Bi_2Te_3$) were (003) direction and (009) direction, where the result coincides with the XRD measurement result in FIG. 5A. Similarly, in the selected area electron diffraction (SAED) pattern analysis result of FIG. 7D, only the crystal structure of $Bi_2Te_3$, which is the reaction compound, was measured and the result coincides with the XRD of FIG. 5A and the Raman spectrum analysis of FIG. 5B.

Figure 8A:
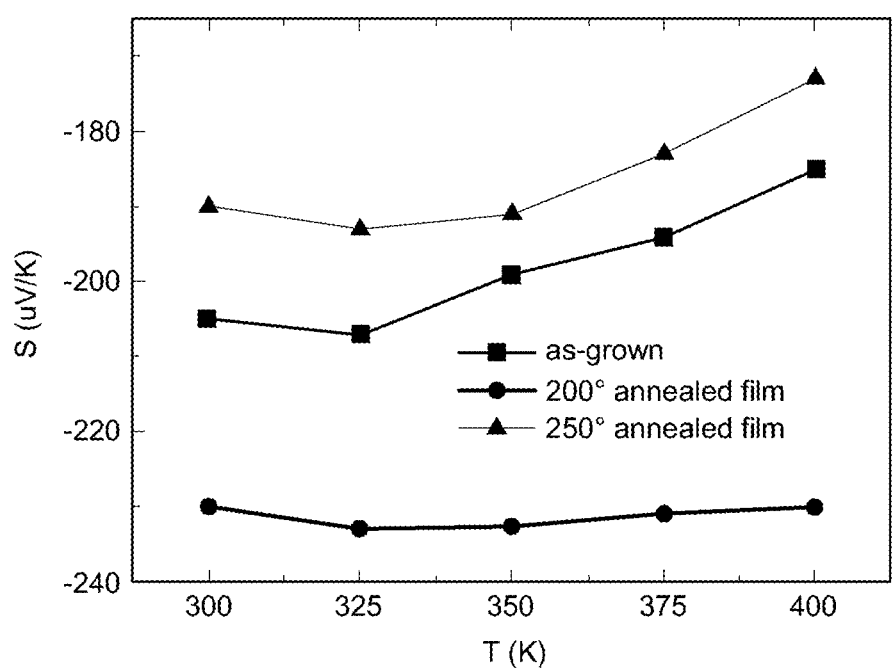
FIGS. 8A through 8E are graphs showing results of calculating thermoelectric characteristics and thermoelectric figure of merits regarding an as-grown intermediate stacked structure, intermediate stacked structure annealed at 200° C., and a porous intermediate stacked structure annealed at 250° C.
Figure 8B:
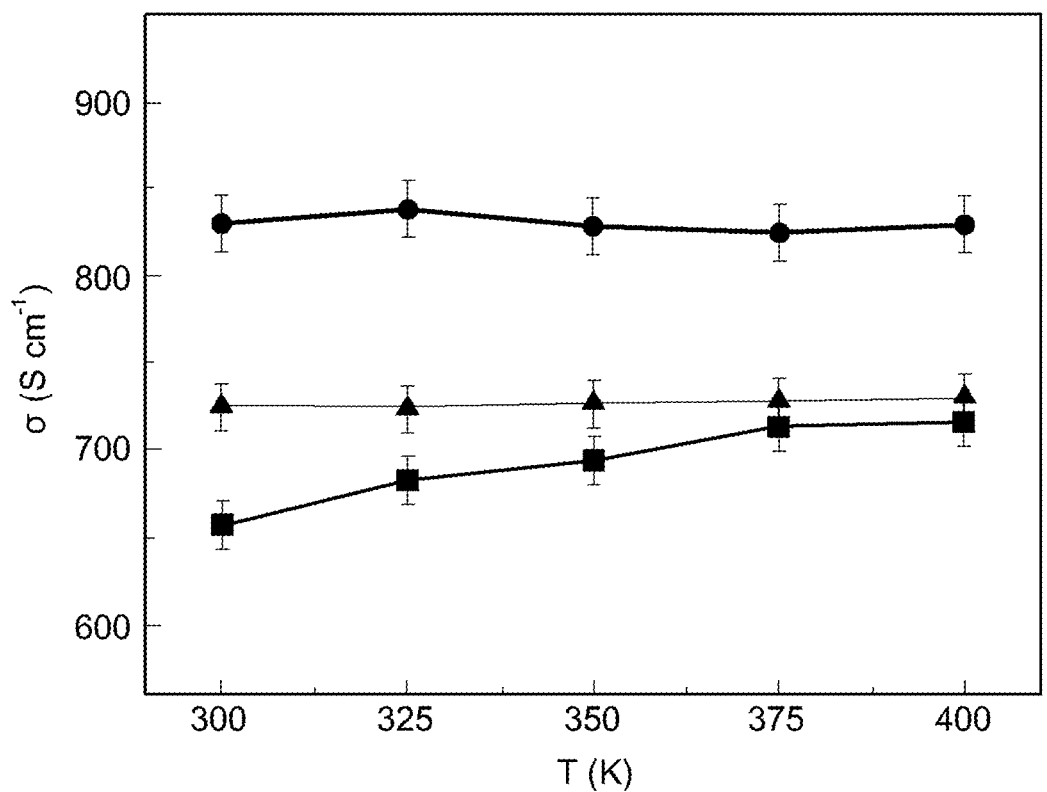
Figure 8C:
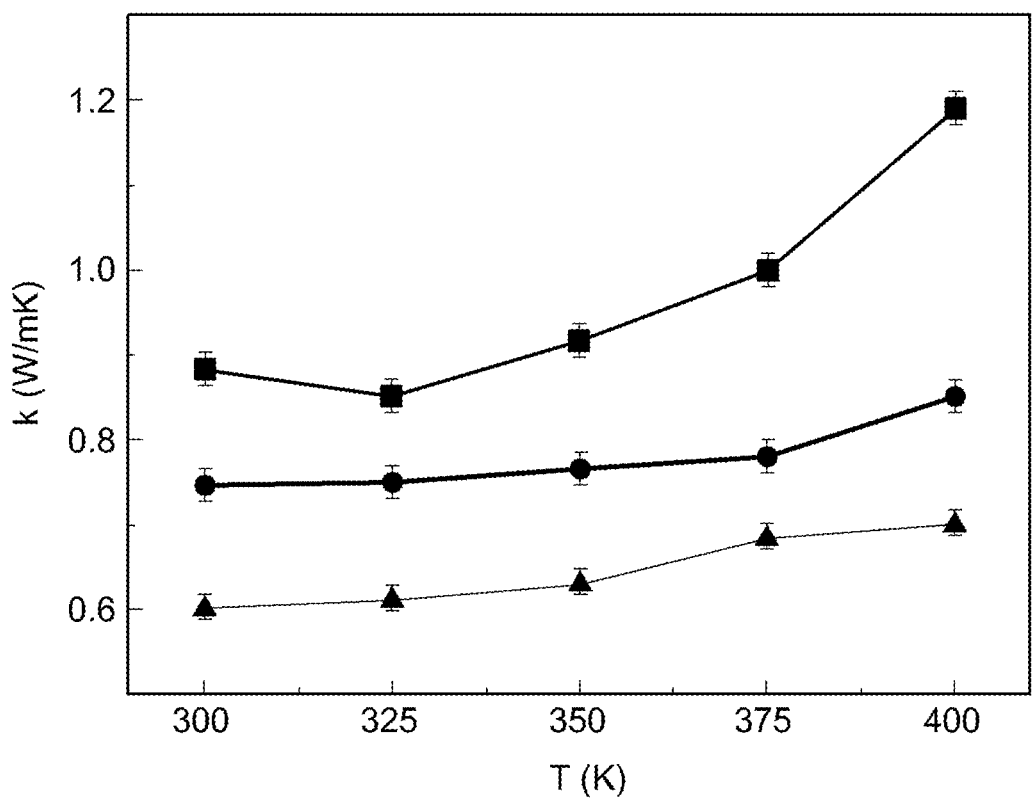
Figure 8D:
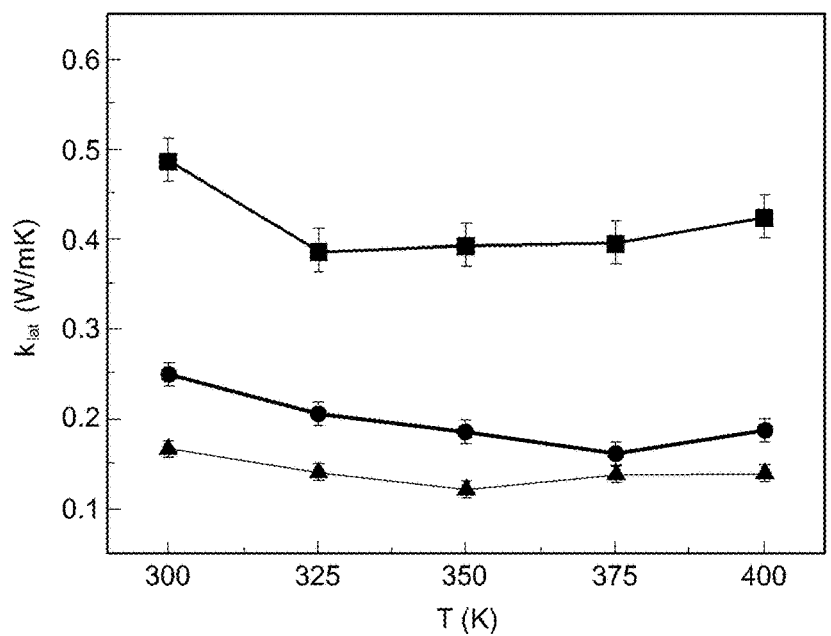
Figure 8E:
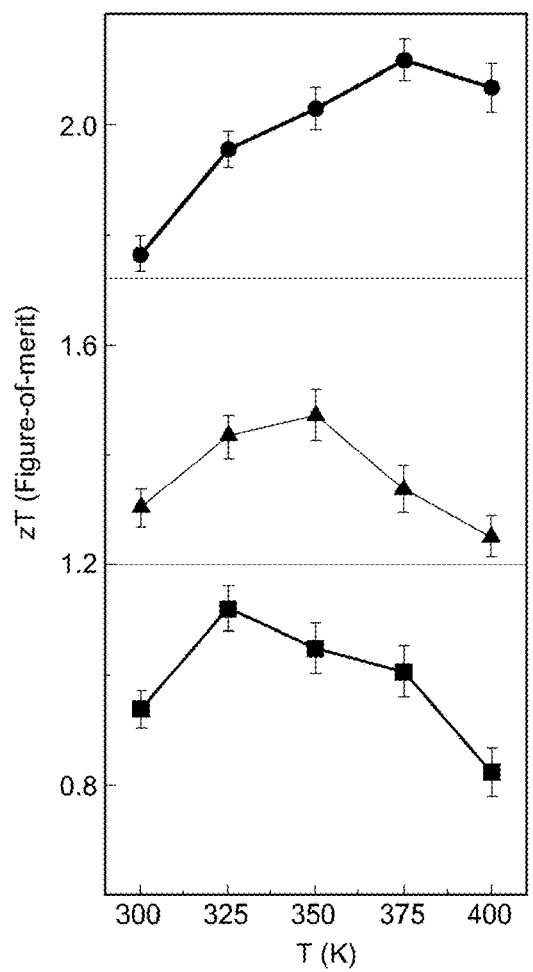

FIGS. 8A through 8E are graphs showing results of calculating thermoelectric characteristics and thermoelectric figure of merits regarding an as-grown intermediate stacked structure (denoted as as-grown), intermediate stacked structure annealed at 200° C. (having a super lattice structure of Te/$Bi_2Te_3$ in a horizontal direction; denoted as 200° C. annealed film), and a porous intermediate stacked structure annealed at 250° C. (denoted as 250° C. annealed film). FIGS. 8A through 8D are graphs showing the Seebeck coefficient S, the electric conductivity σ, the heat conductivity k, and the lattice heat conductivity $k_{lat}$ of the thermoelectric material shown in FIG. 1 at the interval of 25K in the temperature range from 300 K to 400 K FIG. 8E is a graph showing the heat conductivity $k_{lat}$, and FIG. 8E is a graph showing the thermoelectric figure of merit ZT. The thermoelectric figure of merit ZT may be calculated according to Equation 1 below.

$$ZT = \frac{S^2 \sigma}{k} T \qquad \text{[Equation 1]}$$

Where S denotes the Seebeck coefficient, σ denotes the electrical conductivity, k denotes the heat conductivity, and T denotes the absolute temperature. The electric conductivity σ was measured according to Hall measurement. The Hall measurement was performed according to the Van der Pauw method at the room temperature under a magnetic field of 0.5 T applied by using an HMS-300 apparatus of ECOPIA. The Seebeck coefficient S was calculated according to the normal-state definition within the range from 300K to 400K.

The Seebeck coefficient S is obtained by connecting a heater and a heat sink to each other through the thermoelectric material and measuring differences between voltages and temperatures of a heated side and a non-heated side. The maximum temperature fluctuation and voltage resolution are ±0.2 K and 50 nV, respectively. The electrical conductivity σ was measured according to a standard four-point probe method under the maximum temperature variation of ±2 K. The heat conductivity k was measured at the rate of 1 K/min using the 3ω Method coupled with an AC modulation scheme. A sinusoidal input current from 100 to 1000 Hz was used for measuring heat conductivity.

Referring to FIG. 8E, which is the final result, it is confirmed that the thermoelectric material annealed at 200° C. exhibits the highest thermoelectric figure of merit in the temperature range from 300 K to 400 K. The result is significantly improved compared to a thermoelectric effect regarding $Bi_2Te_3$ only. The reason thereof is presumed to be that thermoelectric material according to the present embodiment has an optimal crystal structure capable of controlling the trade-off between the Seebeck coefficient S and the heat conductivity k well. Therefore, the thermoelectric material according to an embodiment of the present invention exhibits low heat conductivity, but exhibits a high electrical conductivity. As a result, a thermoelectric figure of merit may be improved for the thermoelectric material according to an embodiment of the present invention.

Figure 9A:
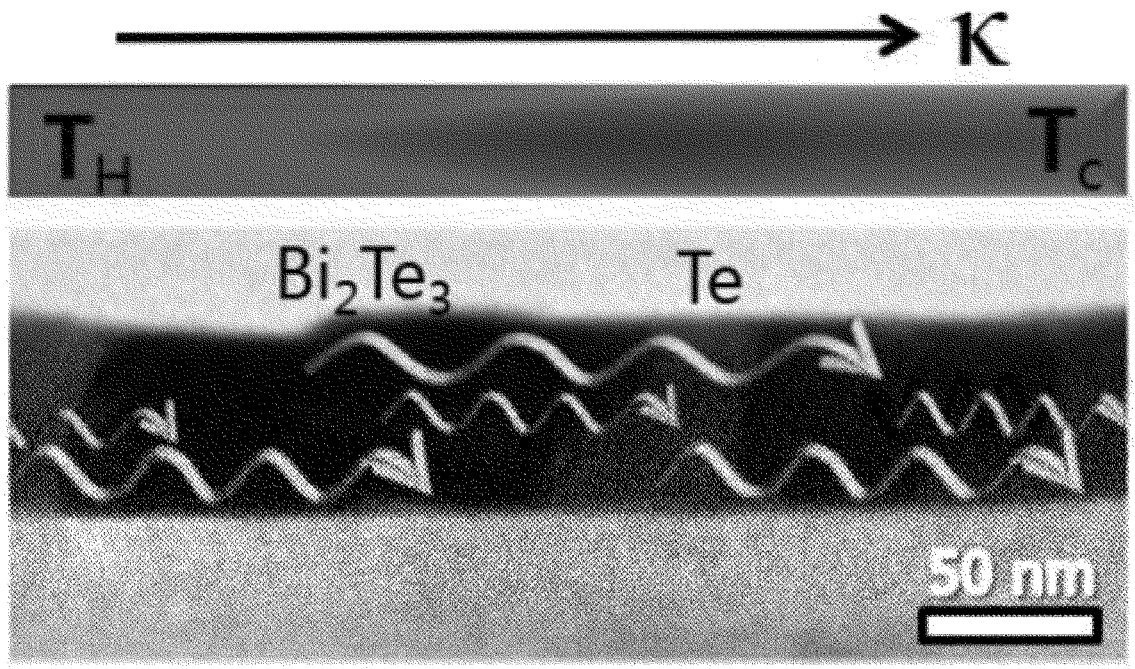
FIGS. 9A and 9B are graphs showing characteristics regarding phonon transfer to a thermoelectric material according to an embodiment of the present invention annealed at 200° C. and a porous intermediate stacked structure annealed at 250° C.
Figure 9B:
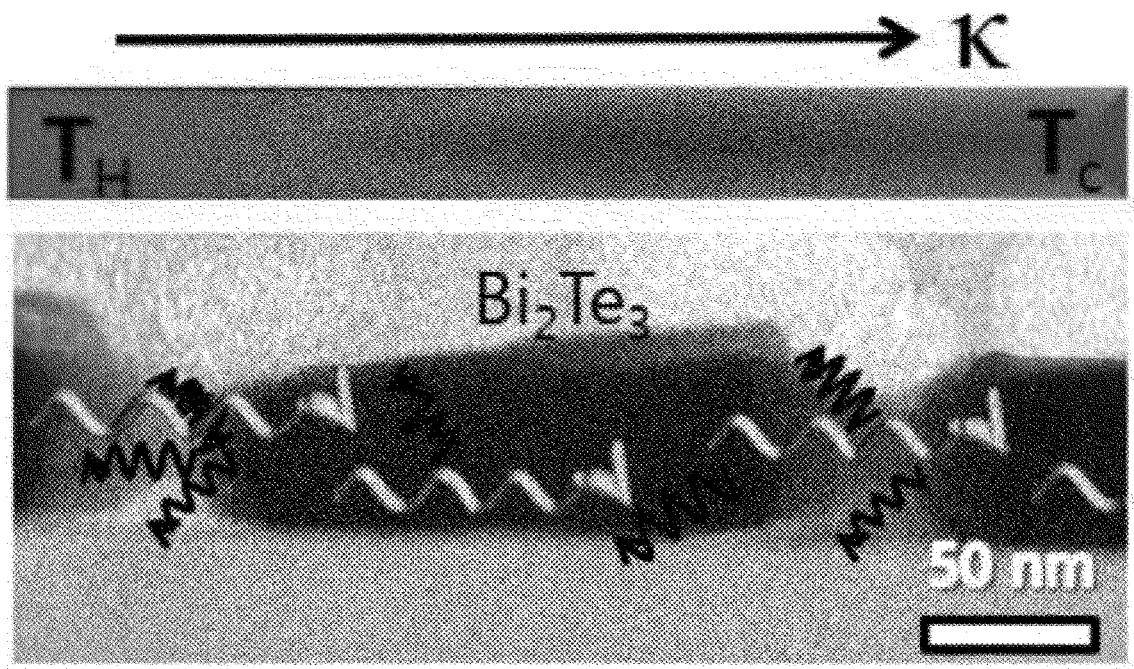

FIGS. 9A and 9B are graphs showing characteristics regarding phonon transfer to a thermoelectric material according to an embodiment of the present invention annealed at 200° C. and a porous intermediate stacked structure annealed at 250° C.

Referring to FIG. 9A, a direction in which lattice phonons of the first material layer Te are transferred (green arrow) and a direction in which lattice phonons of $Bi_2Te_3$ (the second material layer) are transferred (blue arrow) in a crystal grain are shown. Heat is transferred from a high temperature to a low temperature. According to an embodiment of the present invention, since the crystal structures of the first material layer (Te) and the second material layer ($Bi_2Te_3$) are densely synthesized, the heat conductivity is measured higher than that of an intermediate stacked structure annealed at 250° C.

Referring to FIG. 9B, a low heat conductivity is measured in a porous intermediate stacked structure annealed at 250° C. The reason thereof is presumed to be that it is difficult to transfer heat due to the presence of empty spaces between $Bi_2Te_3$ grains, which are the second material layers.

Figure 10A:
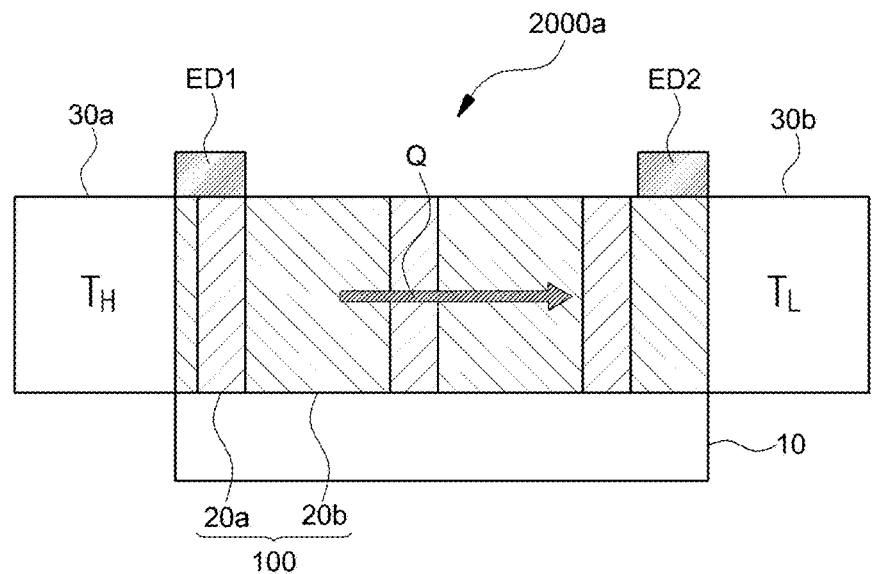
FIGS. 10A and 10B are cross-sectional diagrams showing thermoelectric devices according to various embodiments of the present invention.
Figure 10B:
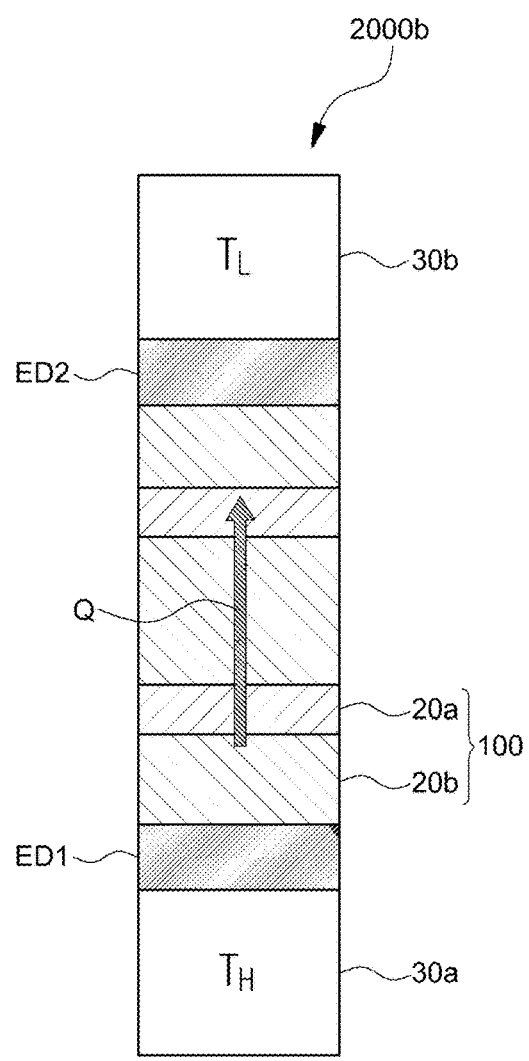

FIGS. 10A and 10B are cross-sectional diagrams showing thermoelectric devices 2000a and 2000b according to various embodiments of the present invention.

Referring to FIG. 10A, the thermoelectric device 2000a is an example of an electromotive force generating device using the Seebeck effect. The thermoelectric device 2000 includes the thermoelectric material 100 that receives heat from a heat source 30a at a high temperature Tx via a first end and generates heat to a heat sink at a low temperature TL via a second end, thereby generating electromotive force. The thermoelectric material 100 may include the first material layer 10a including a chalcogen element and the second material layer 10b including a reaction compound between the chalcogen element and a metal element, as described above.

According to an embodiment, the thermoelectric material 100 may have a super lattice structure, in which the first material layer 10a and the second material layer 10b are alternately arranged in a direction parallel to the main surface of the insulation layer 10. In this case, the heat source 30a and the heat sink 30b may contact the thermoelectric material 100 in a direction in which the first material layer 10a and the second material layer 10b are alternately arranged. Heat may be transferred from the heat source 30a to the heat sink 30b through the thermoelectric material 100 as indicated by the arrow Q.

Electrodes ED1 and ED2 for outputting electromotive force generated by the thermoelectric material 100 may be formed on the top surface of the thermoelectric material 100. The electrodes ED1 and ED2 may be formed of any conductive metal or doped semiconductor material having a low contact resistance or a carbon-based material, such as graphene, but the present invention is not limited thereto.

Referring to FIG. 10B, the first material layer 10a and the second material layer 10b may be alternately arranged. Unlike the thermoelectric device 2000a shown in FIG. 10A, the thermoelectric material 100 may be formed between the electrodes ED1 and ED2. The thermoelectric material 100 may include the first material layer 10a and the second material layer 10b that are alternately arranged along a heat transfer path Q between the electrodes ED1 and ED2.

Although FIGS. 10a and 10b show thermoelectric devices using the Seebeck effect, but the descriptions thereof may be similarly applied to a thermoelectric device using the Peltier effect. According to the above-described embodiments, the intermediate stacked structure may be post-annealed to adjust the crystal structure and composition of the intermediate stacked structure, thereby fabricating a thermoelectric material having an excellent thermoelectric efficiency index. Furthermore, the intermediate stacked structure may be formed even at the room temperature, and thus a flexible substrate including a polymer resin material may be used as an insulating material. As a result, an energy harvesting apparatus using a thermoelectric energy conversion phenomenon, a temperature sensor, or a cooling element may be provided as a wearable element. However, the present invention is not limited thereto. By using the Seebeck effect of a thermoelectric material according to an embodiment of the present invention, heat generated from a waste heat source, such as a computer or an automobile engine, may be converted to electrical energy, thereby providing benefits like new energy development, recycling of waste energy, and environmental protection. Furthermore, by using the Peltier effect, various cooling systems that do not require refrigerant may be embodied.

While one or more embodiments have been described with reference to the figures, it will be understood by those of ordinary skill in the art that various changes in form and details may be made therein without departing from the spirit and scope as defined by the following claims.

The invention claimed is:

1. A method of fabricating a thermoelectric material, the method comprising:
    forming a first temporary layer comprising a metal element on a substrate, wherein the substrate has a main surface;
    forming a second temporary layer comprising a chalcogen element reacting with the metal element on the first temporary layer;
    forming a temporary stacked structure by repeating the forming of the first temporary layer and the forming of the second temporary layer each for at least once in a first direction vertical to the main surface of the substrate; and
    applying energy to the temporary stacked structure to induce a reaction between the metal element of the first temporary layer and the chalcogen element of the second temporary layer and causing all of the metal element of the first temporary layer to completely react with some of the chalcogen element of the second temporary layer and some of the chalcogen element of the second temporary layer to remain unreacted, thereby forming a multilayered structure in which a first material layer comprising the unreacted and remaining chalcogen element and a second material layer comprising a reaction compound between the metal element and the chalcogen element,
    wherein the thermoelectric material has the multilayered structure in which the first material layer is inserted in the second material layer,
    wherein the first material layer and the second material layer are alternately arranged in a second direction parallel to the main surface of the substrate,
    wherein the first direction and second direction are vertical to each other.

2. The method of claim 1,
    wherein the energy is heat energy,
    wherein the heat energy is transferred from the substrate toward the first temporary layer.

3. The method of claim 1, wherein the heat energy has a heating temperature from about 100° C. to about 220° C.

4. The method of claim 1, wherein the thickness of the second temporary layer is greater than the thickness of the first temporary layer.

5. The method of claim 1,
wherein the metal element comprises bismuth (Bi), antimony (Sb), tin (Sn), or a combination thereof,
wherein the chalcogen element comprises sulfur (S), selenium (Se), or tellurium (Te).

6. The method of claim 1,
wherein the first material layer comprises a tellurium (Te) layer,
wherein the second material layer comprises a $Bi_2Te_3$ layer.

7. The method of claim 1 further comprising forming a plurality of pores in the multilayered structure.

8. A method of fabricating a thermoelectric material, the method comprising:
    forming a first temporary layer comprising a metal element on a substrate, wherein the substrate having a main surface;
    forming a second temporary layer comprising a chalcogen element reacting with the metal element on the first temporary layer;
    forming a temporary stacked structure by repeating the forming of the first temporary layer and the forming of the second temporary layer each for at least once in a first direction vertical to the main surface of the substrate; and
    applying energy to the temporary stacked structure to induce a reaction between the metal element of the first temporary layer and the chalcogen element of the second temporary layer and causing all of the metal element of the first temporary layer to completely react with some of the chalcogen element of the second temporary layer and some of the chalcogen element of the second temporary layer to remain unreacted, thereby forming a multilayered structure in which a first material layer comprising the unreacted and remaining chalcogen element and a second material layer comprising a reaction compound between the metal element and the chalcogen element and forming a plurality of pores in the multilayered structure,
wherein the thermoelectric material has the multilayered structure in which the first material layer is inserted in the second material layer,
wherein the first material layer and the second material layer are alternately arranged in a second direction parallel to the main surface of the substrate,
wherein the first direction and second direction are vertical to each other.

* * * * *